(12) United States Patent
Mitsuhashi (10) Patent No.: US 6,323,454 B2
(45) Date of Patent: Nov. 27, 2001

(54) APPARATUS EMPLOYABLE FOR ASHING (75) Inventor: Toshiro Mitsuhashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/738,308

(22) Filed: Dec. 18, 2000

Related U.S. Application Data (62) Division of application No. 09/042,731, filed on Mar. 17, 1998, now Pat. No. 6,199,561.

(30) Foreign Application Priority Data

Aug. 18, 1997 (JP) .................................................... 9-236556

(51) Int. Cl.[7] .................................................................. B23K 10/00
(52) U.S. Cl. ............................... 219/121.43; 219/121.58; 219/121.44; 156/345; 134/1.1
(58) Field of Search ......................... 219/121.43, 121.58, 219/121.44; 156/345, 643.1, 643.6; 118/723 I, 723 MN; 134/1.1, 1.2, 2; 204/298.37, 298.21, 298.38; 427/248.1, 255, 255.1, 255.3

(56) References Cited

U.S. PATENT DOCUMENTS

| | | | |
|---|---|---|---|
| 4,908,095 | * 3/1990 | Kagatsume et al. | 156/643.1 |
| 5,266,154 | * 11/1993 | Tatsumi | 156/643 |
| 5,478,403 | 12/1995 | Shinagawa et al. | |
| 5,871,811 | * 2/1999 | Wang et al. | 427/248.1 |
| 6,005,217 | * 12/1999 | Watanabe et al. | 219/121.43 |

OTHER PUBLICATIONS

Shuzo Fujimura et al., "Ashing of Ion–Implanted Resist Layer," Proc. of 1989 Intern. Symp. on MicroProcess Conference, pp. 227–233.

* cited by examiner

Primary Examiner—Mark Paschall
(74) Attorney, Agent, or Firm—Volentine Francos, PLLC

(57) ABSTRACT

A method for ashing a resist pattern covered by a hardened layer caused by an ion implantation process previously conducted including a first step for conducting an ashing process at a first temperature e.g. 120° C. or less at which no popping phenomenon happens, for removing the hardened layer, and a second step for conducting an ashing process at a second temperature e.g. 150° C. at which the ashing rate is high, for entirely removing the remaining resist pattern, and apparatus employable for the method for ashing a resist pattern covered by a hardened layer including a mechanism for moving up and down a semiconductor wafer to regulate the temperature of the semiconductor wafer and including a shutter which intervenes between the semiconductor wafer and a heater.

6 Claims, 8 Drawing Sheets

APPARATUS EMPLOYABLE FOR ASHING

CROSS REFERENCE TO RELATED APPLICATIONS

This is a divisional application of application Ser. No. 09/042,731, filed Mar. 17, 1998 now U.S. Pat. No. 6,199,561, which is hereby incorporated by reference in its entirety for all purposes.

FIELD OF THE INVENTION

This invention relates to an improvement applicable to a method for ashing and to an apparatus employable for ashing. More specifically, this invention relates to an improvement applicable to a method for ashing and an apparatus employable for an ashing process conducted employing plasma to remove a resist layer which was employed as a mask employable for an ion implantation process.

BACKGROUND OF THE INVENTION

A photo lithography process is one of the important tools employable for producing a semiconductor device. The photo lithography process consists of a step to spin coat a photo resist to produce a photo resist layer on a semiconductor substrate or layer, a step to expose a selected area of the photo resist layer, a step to develop the exposed photo resist layer to produce a photo resist pattern, a step to etch a selected portion of the semiconductor substrate or layer which selected portion is unconcealed by the photo resist pattern, and a step to remove the photo resist pattern which was employed as the etching mask in the previous etching step. The former half of the photo lithography process can be employed to produce a mask employable for an ion implantation process. In other words, a resist pattern produced by selective exposure of a resist layer can be employed as a mask for an ion implantation process employable for introducing impurities in the surface region of a semiconductor substrate or layer. An ashing process conducted employing oxygen radicals or oxygen plasma containing oxygen ions, is usually employed to remove the resist pattern, after an ion implantation process is finished employing the resist pattern as a mask. Since the ashing rate of such an ashing process is accelerated by temperature, it is preferable to conduct such an ashing process under a high temperature.

An ion implantation process conducted employing a resist pattern as a mask is accompanied by a phenomenon to reform the chemical composition of the substance of the top surface of the resist pattern. In other words, the top surface of the resist pattern is converted to a hardened layer, during an ion implantation process.

When a semiconductor substrate or layer selectively covered by a resist pattern of which the top surface has been converted to a hardened layer, is heated up to a high temperature e.g. 150° C. or higher in an ashing apparatus for the purpose to remove the resist pattern, the hardened layer is broken by a high pressure caused by expansion of an evaporated substance located under the hardened layer. This explosive destruction of the hardened layer covering a resist pattern is called popping phenomenon. The popping phenomenon causes dispersion of resist particles, further causing contamination of the surface of the semiconductor substrate or layer and contamination of the internal surface of the ashing apparatus.

An ashing process conducted employing plasma under a low temperature for the purpose to remove an exposed resist pattern covered by a hardened layer, while avoiding popping phenomenon, is readily accompanied by a less ashing rate, resulting in a less magnitude of throughput.

Accordingly, a long standing requirement in this technical field is development of an ashing process for removing a resist pattern which was employed as a mask for an ion implantation process and is covered by a hardened layer and an apparatus employable therefor, both of which are free from popping phenomenon.

OBJECTS AND SUMMARY OF THE INVENTION

Accordingly, the object of this invention is to provide a method for ashing a resist pattern covered by a hardened layer caused by an ion implantation process previously conducted, the ashing process being free from popping phenomenon, and to provide an apparatus employable for ashing a resist pattern covered by a hardened layer caused by an ion implantation process previously conducted, the ashing apparatus enabling an ashing process free from popping phenomenon.

To achieve the first one of the foregoing objects, a method for ashing a resist pattern covered by a hardened layer in accordance with a first embodiment of this invention comprises:

a first step for conducting an ashing process at a first temperature at which no popping phenomenon happens, for removing the hardened layer, and a second step for conducting an ashing process at a second temperature at which the ashing rate is high, for removing the resist pattern.

In the foregoing method for ashing a resist pattern covered by a hardened layer, the first temperature is preferably 120° C. or less and the second temperature is preferably 150° C. or higher.

To achieve the second one of the foregoing objects, an apparatus employable for ashing a resist pattern covered by a hardened layer in accordance with a second embodiment of this invention comprises:

a reaction chamber having a gas inlet for charging a gas into the reaction chamber, a gas outlet for discharging the gas from the reaction chamber and a means for activating the gas to convert the same to a mixture of plasma, radicals and ions, a semiconductor wafer supporter for supporting a semiconductor wafer, the semiconductor wafer supporter being movable in the vertical direction and being able to stay at three independent levels, a circular stage having a surface parallel to the semiconductor wafer supporter and being kept at a predetermined temperature, and a means for moving the semiconductor wafer supporter in the vertical direction and for keeping the semiconductor wafer supporter at the three independent levels.

Derived from an apparatus employable for ashing a resist pattern covered by a hardened layer in accordance with the second embodiment of this invention is an apparatus employable for ashing a resist pattern covered by a hardened layer in accordance with a modification of the second embodiment of this invention, wherein an annular stage movable in the vertical direction is arranged surrounding the circular stage, for the purpose to allow three independent heating positions for the semiconductor wafer supported by the semiconductor wafer supporter.

To achieve the second one of the foregoing objects, an apparatus employable for ashing a resist pattern covered by a hardened layer in accordance with a fourth embodiment of this invention comprises:

a reaction chamber having a gas inlet for charging a gas into the reaction chamber, a gas outlet for discharging the gas from the reaction chamber and a means for activating the gas to convert the same to a mixture of radicals and ions, a heating means for heating a semiconductor wafer, the heating means being arranged in a position to face the semiconductor wafer, a semiconductor wafer supporter means for supporting the semiconductor wafer and for changing the mutual distance between the semiconductor wafer supporter means and the semiconductor wafer and a shutter means to intervene between the heating means and the semiconductor wafer.

In the apparatus for ashing a resist pattern covered by a hardened layer in accordance with the third embodiment of this invention, the heating means can be a lump.

BRIEF DESCRIPTION OF THE DRAWINGS

This invention, together with its various features and advantages, can be readily understood from the following more detailed description presented in conjunction with the following drawings, in which.

DETAILED DESCRIPTION OF THE PREFERRED EMBODIMENTS

Referring to drawings, a method for ashing a resist pattern covered by a hardened layer in accordance with one embodiment of this invention and three apparatus employable for ashing a resist pattern covered by a hardened layer in accordance with three independent embodiments of this invention will be described below.

FIRST EMBODIMENT

A method for ashing a resist pattern covered by a hardened layer having two steps including a first step to conduct an ashing process at a low temperature at which no popping phenomenon happens, to remove the hardened layer and a second step to conduct an ashing process at a high temperature at which the ashing rate is high, to remove the remaining resist pattern.

Figure 1:
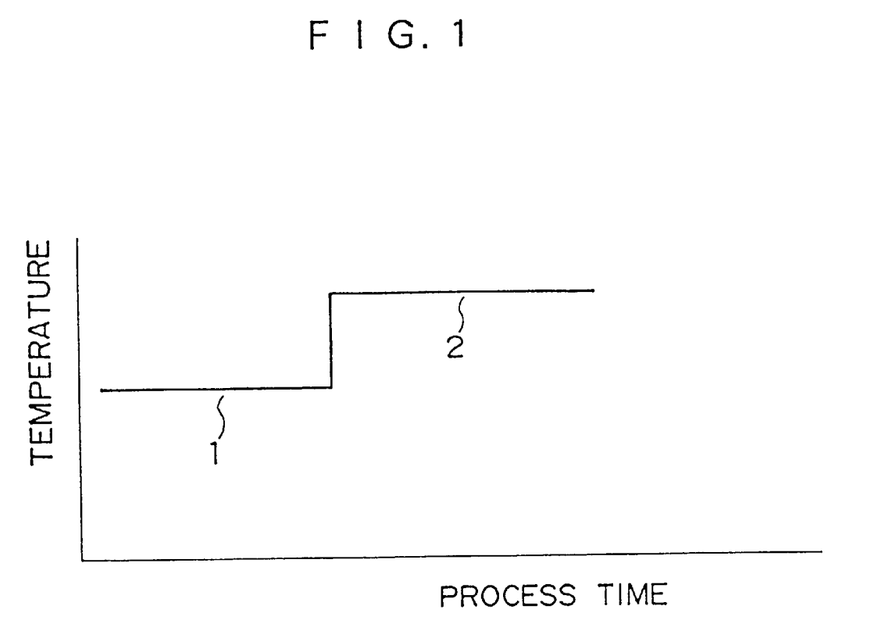
FIG. 1 is a graph showing the thermal sequence of an ashing process for removing a resist layer covered by a hardened layer caused by an ion implantation process previously conducted, in accordance with a first embodiment of this invention.

Referring to FIG. 1, an ashing process is applied to a semiconductor substrate or layer selectively covered by a resist pattern of which the top surface has been converted to a hardened layer due to a result of an ion implantation process previously conducted, at a low temperature e.g. 120° C. or less to remove the hardened layer without occurring popping phenomenon. The low temperature shown by (1) in FIG. 1 is defined as a temperature at which no popping phenomenon happens for a specific resist.

After the hardened layer is removed, an ashing process is applied again to a semiconductor substrate or layer selectively covered by a resist pattern, at a high temperature e.g. 150° C. or higher to remove the remaining resist pattern with a high ashing rate. The high temperature shown by (2) in FIG. 1 is defined as a temperature at which the ashing rate is high for the specific resist.

By the foregoing two-step process, a piled layer of a hardened layer and a resist pattern can be removed by ashing without being accompanied by a popping phenomenon and with a high ashing rate.

The foregoing description has clarified that a method for ashing a resist pattern covered by a hardened layer, which method is free from a popping phenomenon has successfully been provided by the first embodiment of this invention.

SECOND EMBODIMENT

An apparatus employable for an ashing process, the apparatus being equipped with means to keep a semiconductor substrate at plural degrees of temperature to enable a two-step ashing process conducted at two independent degrees of temperature.

Figure 2:
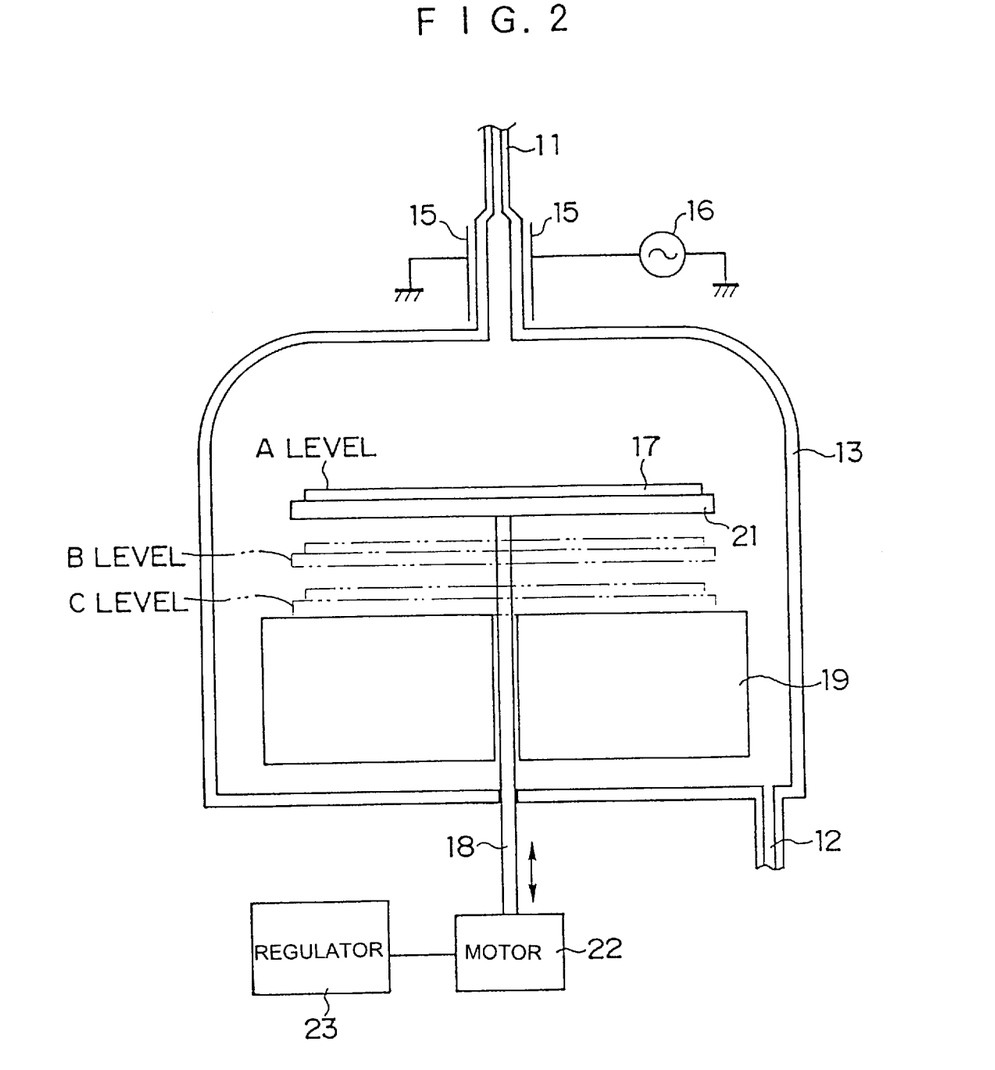
FIG. 2 is a schematic cross section of an apparatus employable for ashing a resist layer covered by a hardened layer caused by an ion implantation process previously conducted, in accordance with a second embodiment of this invention.

Referring to FIG. 2, a reaction chamber (13) has a gas inlet (11) provided at the top thereof to charge a gas e.g. $O_2$ gas into the reaction chamber (13) and a gas outlet (12) provided at the bottom thereof to discharge a gas containing plasma and radicals out of the reaction chamber (13). A pair of electric discharge electrodes (15) is arranged along a path connecting the gas inlet (11) and the reaction chamber (13)

to activate the $O_2$ gas into a mixture of O radicals and O plasma. A high frequency power supply (16) is connected the pair of electric discharge electrodes (15) to generate a high frequency electric discharge between the pair of electric discharge electrodes (15).

A semiconductor wafer supporter (21) which supports a semiconductor wafer (17) is supported by a supporting rod (18) which is movable in the vertical direction. In this example, a mechanism (22) consisting of an electric motor (not shown) and a set of worm and gear (not shown) moves the supporting rod (18) supporting the semiconductor wafer (17) up and down and stays the semiconductor wafer supporter (21) at three selected levels (A), (B) and (C), in response to a command issued by a regulator (23).

A circular stage (19) is arranged to surround the supporting rod (18). The temperature of the circular stage (19) is controlled at a temperature by a heater arranged therein (not shown).

In this example, the semiconductor wafer supporter (21) is designed to be able to stay at three independent levels including a top level shown by (A) in the drawing, a medium level in which the gap between the semiconductor wafer supporter (21) and the circular stage (19) is several mm and which is shown by (B) in the drawing and a lower level in which the semiconductor wafer supporter (21) contacts the circular stage (19) shown by (C) in the drawing. A semiconductor wafer (17) is carried into the top level (A), when it is charged into the reaction chamber (13) (The means employable for charging a semiconductor wafer (17) into the reaction chamber (13) is not shown in the drawings.). The semiconductor wafer (17) is moved downward to the medium level (B), when the first ashing step conducted at a low temperature e.g. 120° C. or less is conducted. The semiconductor wafer (17) is further moved to the lower level (C), when the second ashing step conducted at a high temperature e.g. 150° C. or higher is conducted.

When an ashing process is conducted employing the foregoing apparatus, the semiconductor wafer supporter (21) which has received a semiconductor wafer (17) thereon at the top level (A) is lowered to the medium level (B), at which the temperature of the semiconductor wafer (17) is kept at a low temperature e.g. 120° C. or less at which no popping phenomenon happens. After the internal pressure of the reaction chamber (13) is made vacuum, $O_2$ gas is charged into the reaction chamber (13) and a high frequency electric discharge is caused to happen between the electrodes (15). As a result, the semiconductor wafer (17) is caused to contact O radicals and O plasma at a temperature of 120° C. or less. Since this reaction conditions do not cause a popping phenomenon, the top layer of the semiconductor wafer (17) or the hardened layer is removed for the first place without being accompanied by a popping phenomenon.

After the hardened layer is entirely removed, the semiconductor wafer (17) is lowered to the lower level (C) where the temperature of the semiconductor wafer (17) is kept at a temperature of 150° C. or higher, at which temperature the ashing rate is higher than that in the previous condition. As a result, the resist layer is entirely removed in a short period.

After the resist layer is entirely removed, an inert gas e.g. $N_2$ gas is charged in the reaction chamber (13). After the internal pressure of the reaction chamber (13) returned to 1 at., the semiconductor wafer (17) is taken away from the reaction chamber (13).

It is noted that since the temperature of the semiconductor wafer (17) can be changed simply by changing the level of the semiconductor wafer supporter (21) without controlling the temperature of the circular stage (19), the temperature of the semiconductor wafer (17) can be changed easily and quickly. This results in reduction of the time necessary for an ashing process.

The foregoing description has clarified that an apparatus employable for an ashing process and which enables an ashing process free from a popping phenomenon and which enables an ashing process with a high ashing rate, has been successfully provided by the second embodiment of this invention.

THIRD EMBODIMENT

An apparatus employable for an ashing process in accordance with the second embodiment, being further added an annular stage movable in the vertical direction, the annular stage being arranged surrounding the circular stage, whereby the semiconductor wafer supported by the semiconductor wafer supporter being allowed three independent heating positions including a first position at which the semiconductor supporter is remote from the circular stage, a second position at which the semiconductor wafer supporter is on the annular stage which is not in contact with the circular stage and a third position at which the semiconductor wafer supporter is on the annular stage and in contact with the circular stage as well.

Figure 3:
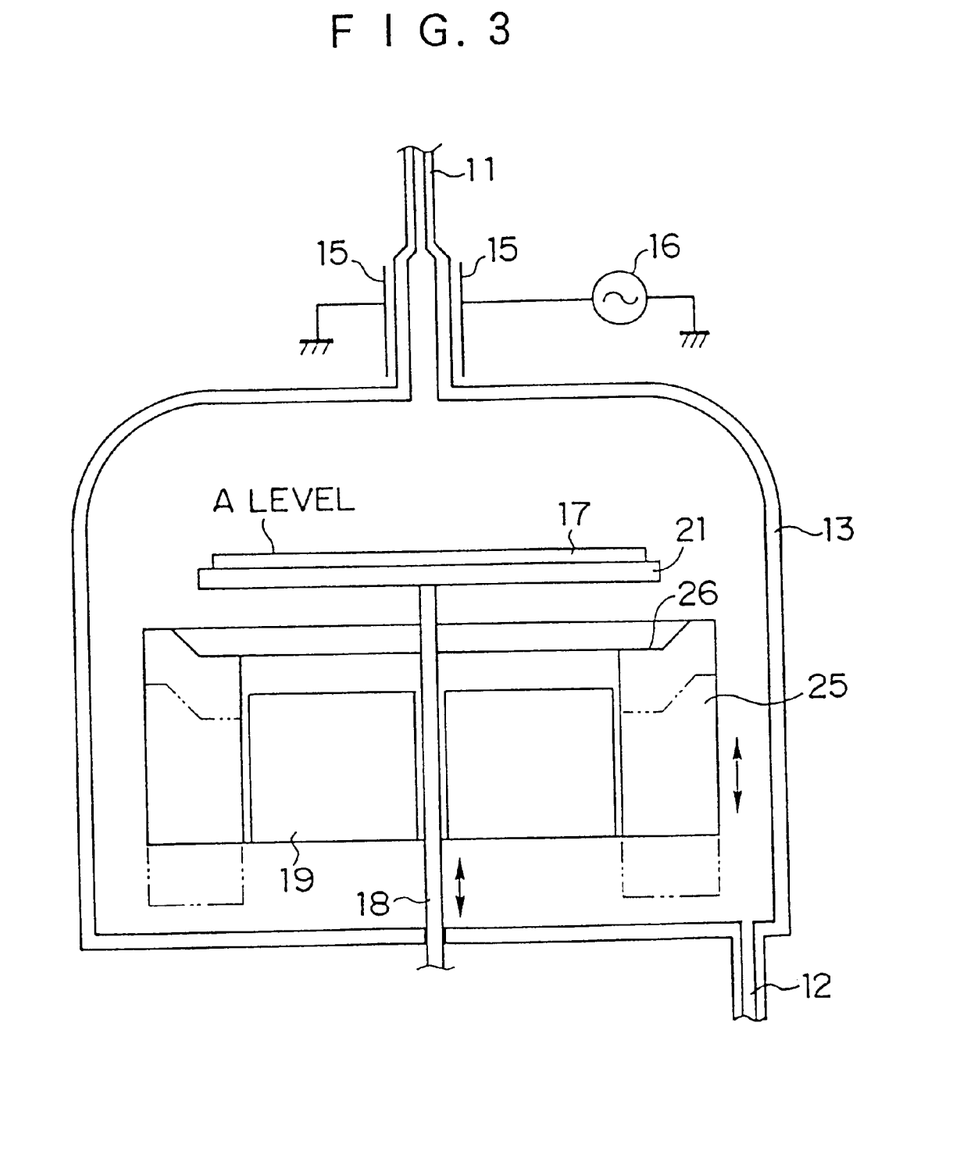
FIG. 3 is a schematic cross section of an apparatus employable for ashing a resist layer covered by a hardened layer caused by an ion implantation process previously conducted, in accordance with a modification of the second embodiment of this invention, the schematic cross section showing a position in which a semiconductor wafer supporting means stays on the top level.

Referring to FIG. 3, the structure of the reaction chamber (13) proper and the supporting rod with the mechanism (22) and (23) is identical to that of the second embodiment.

Referring to FIG. 3, the circular stage (19) is surrounded by an annular stage (25) movable in the vertical direction as shown by arrows. The annular stage (25) is provided an circular recess (26) produced on the top surface thereof to receive the semiconductor wafer supporter (21) thereon.

The semiconductor wafer (17) is carried onto the top of the semiconductor wafer supporter (21) located at the top level (A) shown in FIG. 3 (The means employable for charging a semiconductor wafer (17) into the reaction chamber (13) is not shown in the drawings.).

Figure 4:
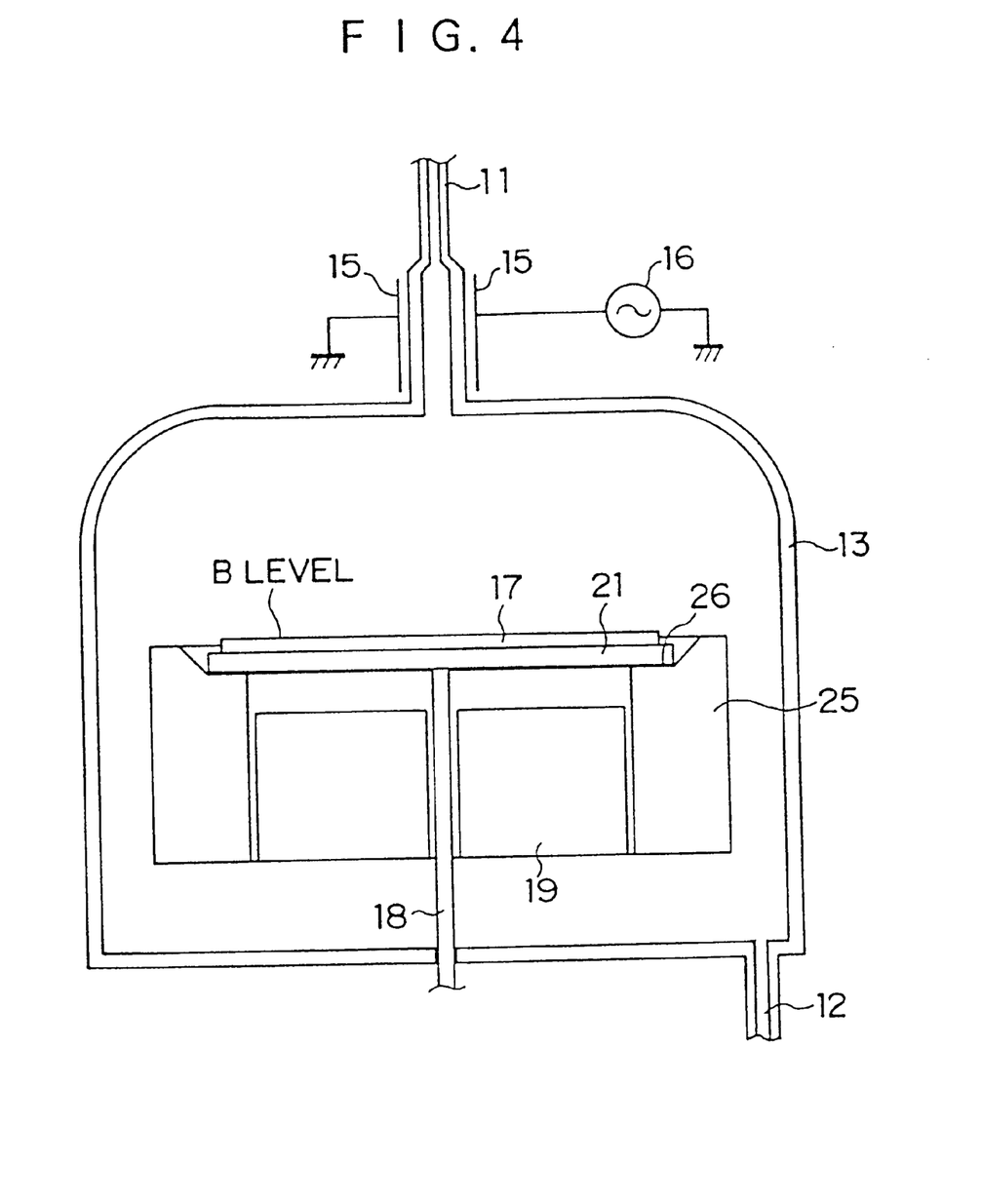
FIG. 4 is a schematic cross section of an apparatus employable for ashing a resist layer covered by a hardened layer caused by an ion implantation process previously conducted, in accordance with a modification of the second embodiment of this invention, the schematic cross section showing a position in which a semiconductor wafer supporting means stays on the medium level.

Referring to FIG. 4, when an ashing process is conducted, the semiconductor wafer supporter (21) which has received the semiconductor wafer (17) thereon is lowered to the medium level (B) at which the semiconductor wafer supporter (21) is placed in the circular recess (26) of the annular stage (25), while the top surface of the circular stage (19) is not flush with the top level of the circular recess (26). Since the top surface of the circular stage (19) is remote from the top surface of the circular recess (26), the temperature of the semiconductor wafer supporter (21) and the semiconductor wafer (17) is kept at low temperature e.g. 120° C. or less at which no popping phenomenon happens. The first step of the ashing process is conducted at this position.

Figure 5:
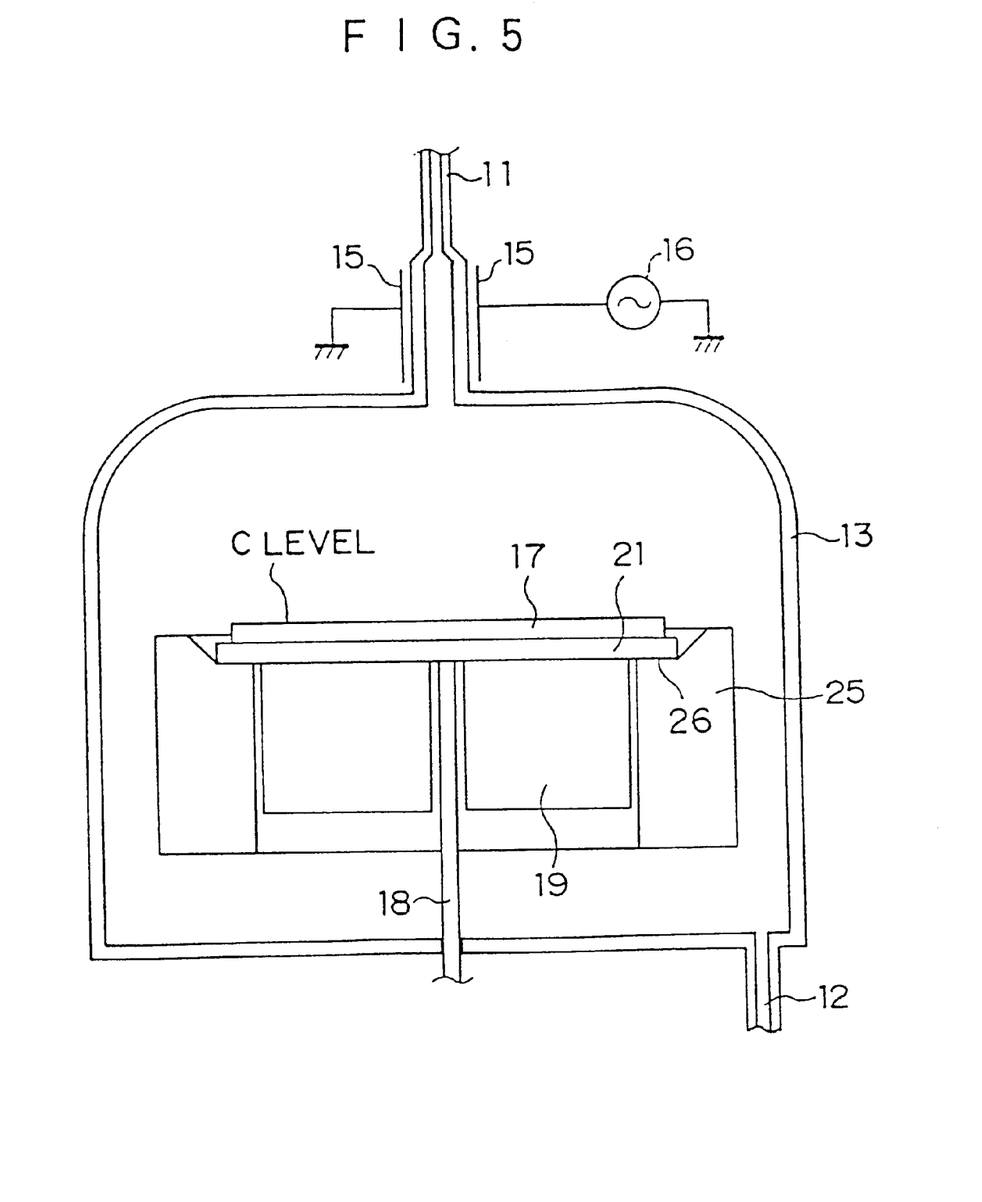
FIG. 5 is a schematic cross section of an apparatus employable for ashing a resist layer covered by a hardened layer caused by an ion implantation process previously conducted, in accordance with a modification of the second embodiment of this invention, the schematic cross section showing a position in which a semiconductor wafer supporting means stays on the lower level.

Referring to FIG. 5, after the first step of the ashing process is finished, the circular stage (19) is moved upward to cause the top surface of the circular stage (19) to contact the rear surface of the semiconductor wafer supporter (21), to realize the lower level (C) where the temperature of the semiconductor wafer (17) is kept at 150° C. or higher, because the semiconductor wafer supporter (21) is in contact with the circular stage (19). The second step of the ashing process is conducted at this position.

The foregoing description has clarified that an apparatus employable for an ashing process and which enables an ashing process free from a popping phenomenon and which enables an ashing process with with a high ashing rate, has been successfully provided by this modification of the third embodiment of this invention, as well.

FOURTH EMBODIMENT

An apparatus employable for an ashing process, the apparatus being equipped with a semiconductor wafer supporter means for supporting a semiconductor wafer and for changing the mutual distance between the semiconductor wafer and the semiconductor wafer supporter means, and a shutter means to control radiation of heat from the heater.

Figure 6:
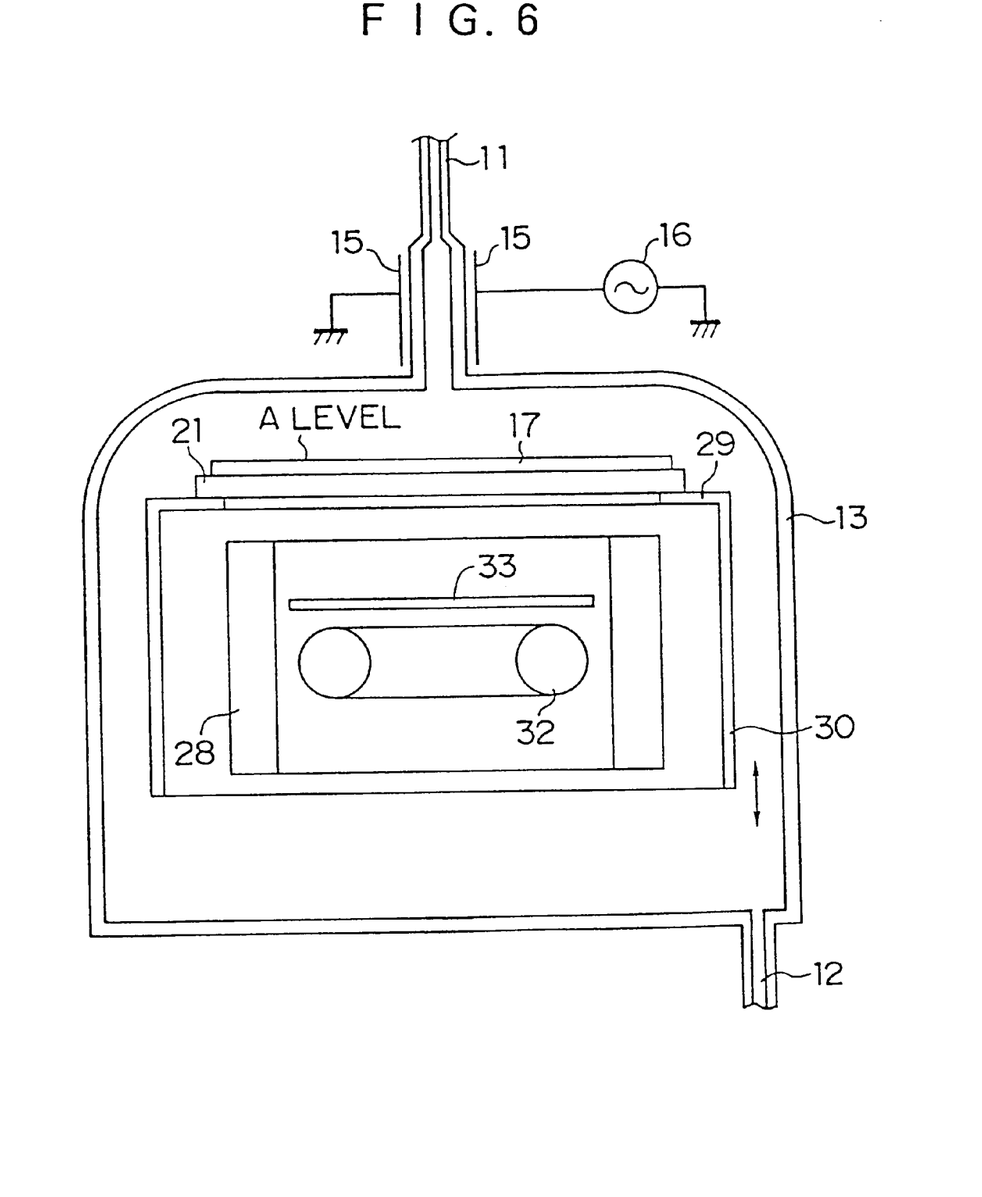
FIG. 6 is a schematic cross section of an apparatus employable for ashing a resist layer covered by a hardened layer caused by an ion implantation process previously conducted, in accordance with a fourth embodiment of this invention, the schematic cross section showing a position in which a semiconductor wafer stays on the top level.

Referring to FIG. 6, the structure of the reaction chamber (13) proper is identical to that of the second or third embodiment.

Referring to FIG. 6, an annular supporter (28) which confines a lamp (32) acting as a heating means and a shutter (33), is surrounded by an annular wall (30) movable in the vertical direction as shown by arrows. A semiconductor wafer supporter (21) which supports a semiconductor wafer (17) is supported by the top flange (29) of the annular wall (30).

When the semiconductor wafer (17) is carried into a reaction chamber, it is placed in the position shown by FIG. 6 (The means employable for charging a semiconductor wafer (17) into the reaction chamber (13) is not shown in the drawings.). In this position, since the semiconductor wafer (17) is fairly remote from the lamp (32), in addition to that the lamp (32) is isolated by the shutter (33), it is not heated to keep the semiconductor wafer (17) cool.

Figure 7:
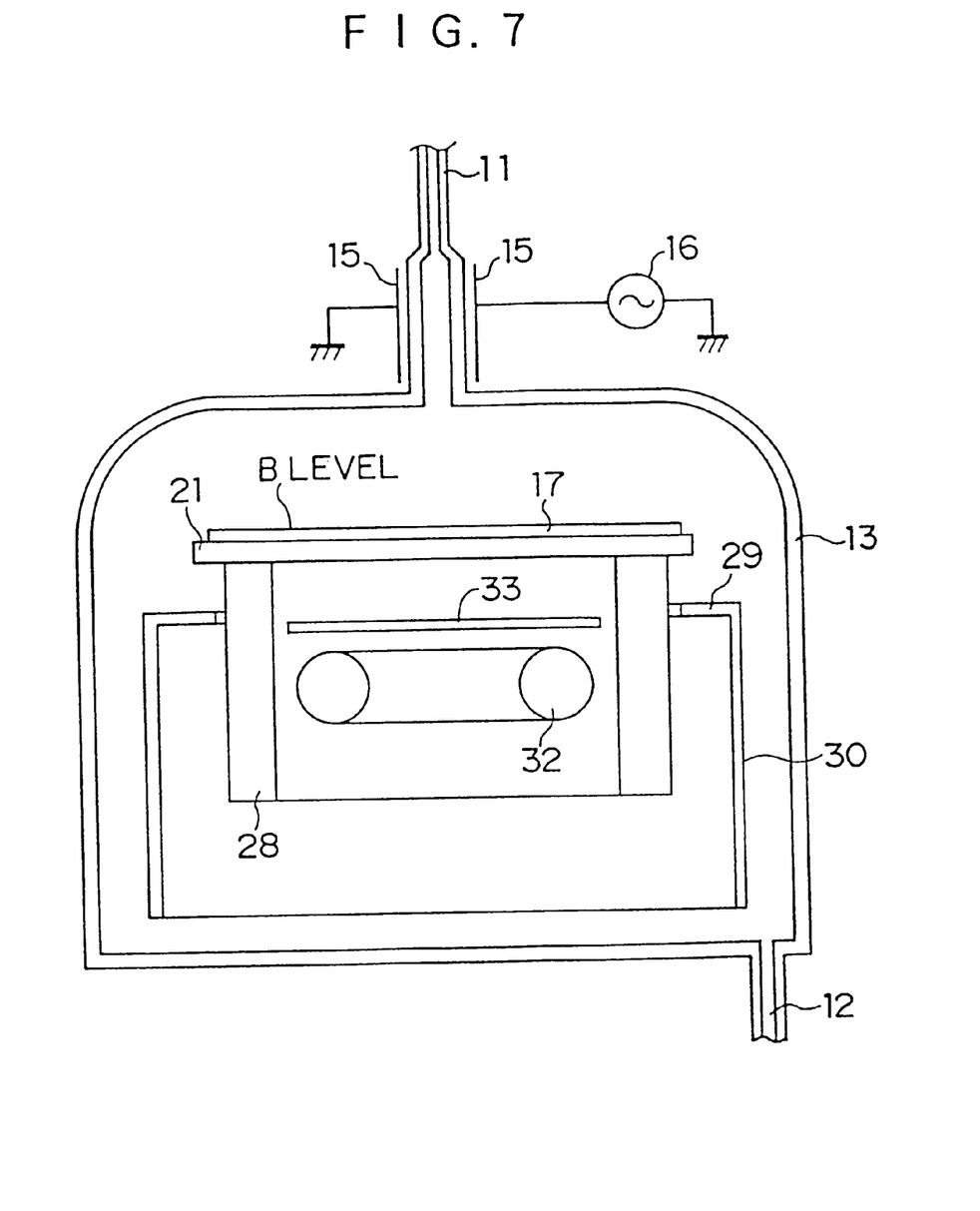
FIG. 7 is a schematic cross section of an apparatus employable for ashing a resist layer covered by a hardened layer caused by an ion implantation process previously conducted, in accordance with a fourth embodiment of this invention, the schematic cross section showing a position in which a semiconductor wafer stays on the medium level.

Referring to FIG. 7, when an ashing process is conducted, the annular wall (30) is lowered to a position shown by FIG. 7, at which position, the semiconductor wafer supporter (21) supporting the semiconductor wafer (17) turns out to be supported by the annular supporter (28). In this position, albeit the semiconductor wafer (17) is located close to the lamp (32), since the shutter disturbs heat to reach the semiconductor wafer (17) to some extent, the temperature of the semiconductor wafer (17) is kept at a medium level or a temperature at which a popping phenomenon hardly happens or 120° C. or less. At this location, the first step of the ashing process is conducted.

Figure 8:
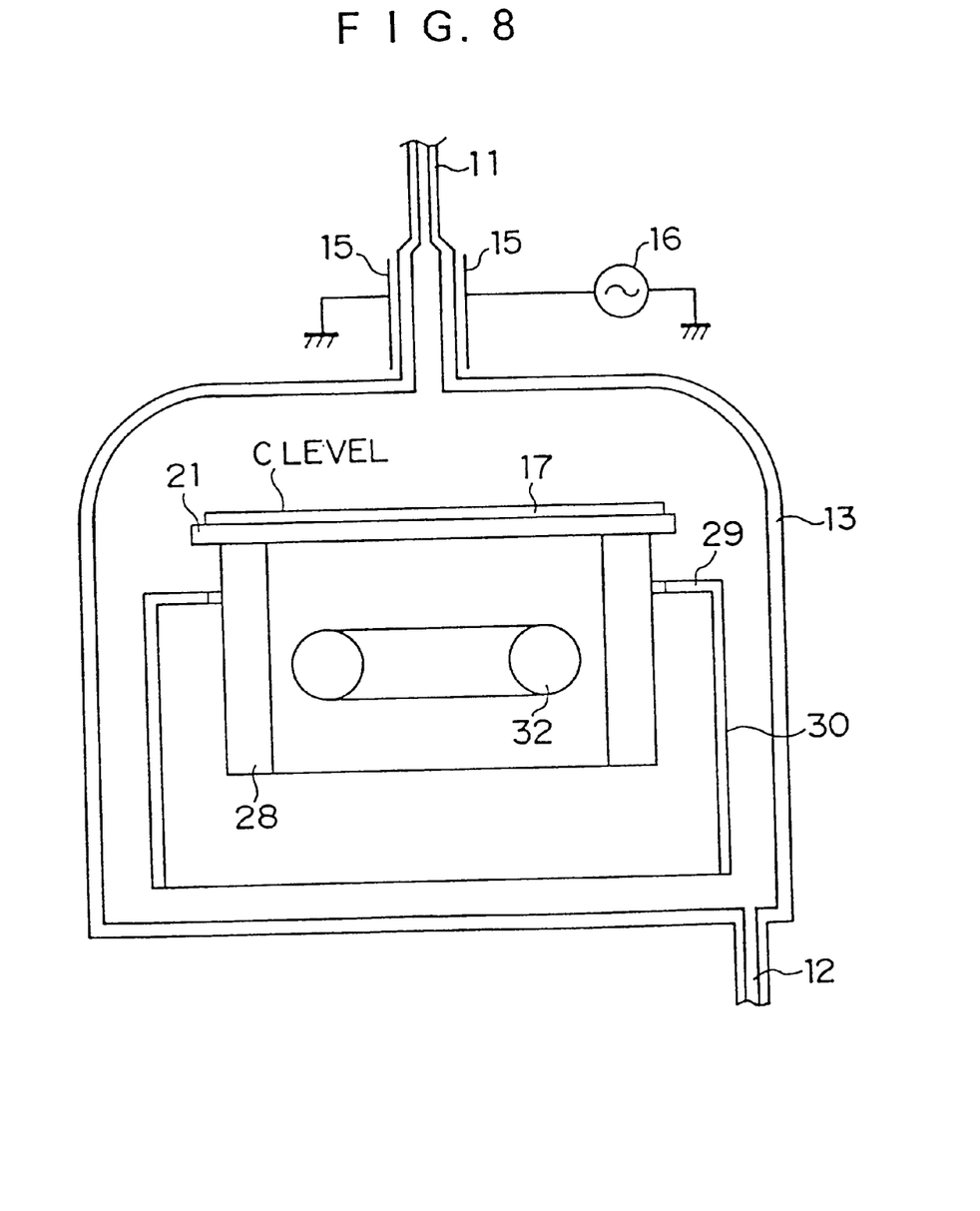
FIG. 8 is a schematic cross section of an apparatus employable for ashing a resist layer covered by a hardened layer caused by an ion implantation process previously conducted, in accordance with a fourth embodiment of this invention, the schematic cross section showing a position in which a semiconductor wafer stays on the lower level.

Referring to FIG. 8, after the first step of the ashing process is finished, the shutter (33) is removed from the location intervening between the semiconductor wafer supporter (21) and the lamp (32). Since the full amount of the heat of the lamp (32) readily reaches the semiconductor wafer (17), the temperature of the semiconductor wafer (17) is kept at a high level or 150° C. or higher at which the ashing rate is fairly high. The second step of the ashing process is conducted at this position.

It is noted that since the temperature of the semiconductor wafer (17) can be changed simply by a simple mechanical structure, without necessity to control the temperature of the heater. This results in reduction of the time necessary for an ashing process.

The foregoing description has clarified that an apparatus employable for an ashing process and which enables an ashing process free from a popping phenomenon and which enables an ashing process with a high ashing rate, has been successfully provided by the fourth embodiment of this invention.

Although this invention has been described with reference to specific embodiments, this description is not meant to be construed in a limiting sense. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. An apparatus for ashing a resist pattern covered by a hardened layer, said apparatus comprising:

a reaction chamber having a gas inlet for charging a gas into said reaction chamber, a gas outlet for discharging said gas from said reaction chamber and a means for activating said gas to convert said gas to a mixture of plasma, radicals and ions, a wafer support having an upper surface which supports a semiconductor wafer, a heater which is spaced below said wafer support and which heats the semiconductor wafer, and a removable shutter which is selectively interposed between said wafer support and said heater, wherein said removable shutter at least partially blocks said heater from heating the semiconductor wafer when said shutter is interposed between said wafer support and said heater.

2. The apparatus of claim 1, wherein said heater is a lamp.

3. The apparatus of claim 1, further comprising a first annular support which supports said wafer support and which defines a hollow region below said wafer support, and a second annular support which houses said heater and said removable shutter and which is contained within the hollow region defined by said first annular support.

4. The apparatus of claim 3, wherein said first annular support is movable in a vertical direction relative to said second annular support.

5. The apparatus of claim 2, further comprising a first annular support which supports said wafer support and which defines a hollow region below said wafer support, and a second annular support which houses said heater and said removable shutter and which is contained within the hollow region defined by said first annular support.

6. The apparatus of claim 5, wherein said first annular support is movable in a vertical direction relative to said second annular support.

* * * * *